Oct. 28, 1969 T. P. NOWALK ET AL 3,475,235
PROCESS FOR FABRICATING A SEMICONDUCTOR DEVICE
Filed Oct. 5, 1966
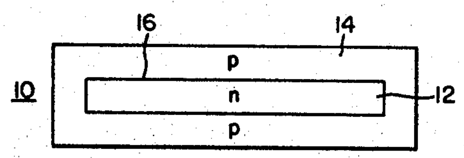
FIG. 1.
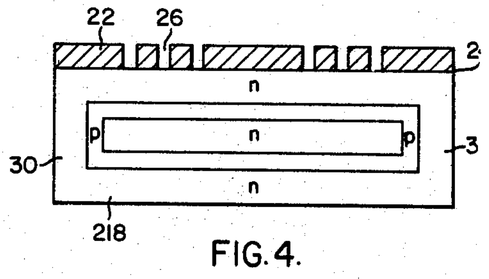
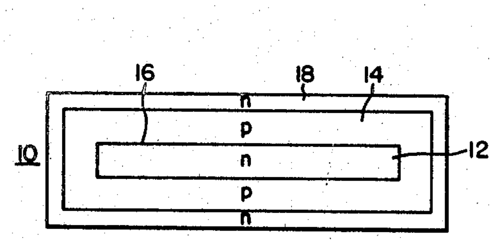
FIG. 2.
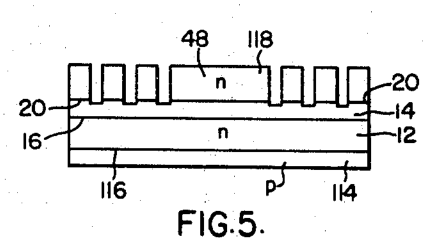
FIG. 5.
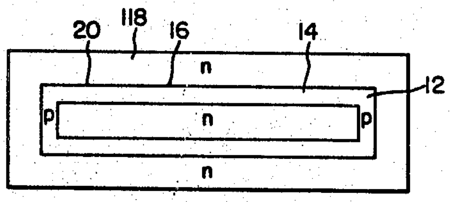
FIG. 3.
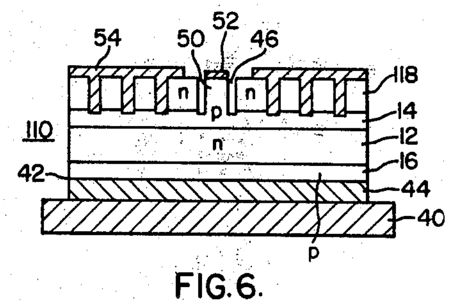
FIG. 6.
WITNESSES
Theodore F. Wrobel
James F. Young
INVENTORS
Thomas P. Nowalk
and Adalbert Knopp
BY
C. L. Menzemer
ATTORNEY 3,475,235
Patented Oct. 28, 1969

3,475,235

PROCESS FOR FABRICATING A SEMICONDUCTOR DEVICE

Thomas P. Nowalk and Adalbert Knopp, Greenburg, Pa., assignors to Westinghouse Electric Corporation, Pittsburgh, Pa., a corporation of Pennsylvania Filed Oct. 5, 1966, Ser. No. 584,444
Int. Cl. H01l 7/44, 7/50
U.S. Cl. 148—190 4 Claims

ABSTRACT OF THE DISCLOSURE

This disclosure is directed to a process for forming diffused regions within a body of semiconductor regions without employing oxide masks.

This invention relates to a new and novel process for preparing a semiconductor device.

It is the general practice when preparing a semiconductor device by employing the diffusion process, to first deposit an oxide coating on at least one surface of a wafer of semiconductor material and then to deposit a layer of a photoresist masking material over the oxide layer.

This procedure is not too satisfactory because it requires heating the wafer to a high temperature in an oxygen ambient which often results in the deterioration of device characteristics.

An object of the present invention is to provide a process for preparing a semiconductor device by diffusion techniques carried out in the absence of any oxide layers.

Other objects will, in part, be obvious and will, in part, appear hereinafter.

For a better understanding of the nature and objects of the invention, reference should be had to the following detailed description and drawing in which:

FIGURE 1 is a side view, in section, of a wafer of semiconductor material suitable for use in accordance with the teachings of this invention;

FIGS. 2 to 5 are side views, in section, of the wafer of FIG. 1 being processed in accordance with the teachings of this invention; and FIG. 6 is a side view of a semiconductor device prepared in accordance with the teachings of this invention.

In accordance with the present invention and attainment of the foregoing objects there is provided a process for making a semiconductor device comprising (1) depositing a coating of a doping impurity capable of forming a region of a second-type of semiconductivity upon all exposed surfaces of a body of semiconductor material, said body having a central core region of a second-type of semiconductivity completely surrounded by a peripheral region of a first-type of semiconductivity, said peripheral region extending from said core region to the surfaces of said wafer, and there being a p-n junction between said core region and said peripheral region, (2) diffusing said doping material into said peripheral region to a depth less than the thickness of said peripheral region, whereby a second region of second-type semiconductivity is formed within said wafer, and a p-n junction exists between said second region of second-type semiconductivity and said peripheral region, (3) disposing a photoresist mark in a predetermined pattern on the top surface of said wafer, (4) etching the top surface of said wafer whereby said pattern is etched completely through said second region of second-type semiconductivity to said region of first-type semiconductivity and etching the other surfaces of said wafer whereby all of the remaining second region of second-type semiconductivity is removed from the wafer and (5) affixing electrical contacts to selected regions of the wafer.

More specifically, and with reference to FIGURE 1, there is shown a body or wafer 10 of a semiconductor material suitable for use in accordance with the teachings of this invention.

For purposes of explanation, it will be assumed that the body 10 is of silicon, however, it could be of germanium, silicon carbide, a compound consisting of either Group III-Group V elements or of Group II-Group VI elements.

The wafer 10 has a core region 12 of one type of semiconductivity, for example n-type, and a peripheral region 14 of an opposite type of semiconductivity, in this case p-type. There is a p-n junction 16 between regions 12 and 14.

Satisfactory devices have been made from wafers of the type shown in FIG. 1 when the core region 12 is n-type silicon having a resistivity of from 25 to 75 ohm-cm. and the peripheral region 14 is doped to a concentration of $10^{18}$ atoms per cc.

With reference to FIG. 2, the wafer 10 is disposed in an open-tube-type furnace and a coating 18 of an n-type dopant is deposited on all surfaces of the wafer 10. Examples of suitable n-type dopants which may be employed are phosphorus, arsenic and antimony. Particularly good results are realized when phosphorus is used.

The wafer 10 is disposed in one end of an open tube furnace and a quantity of $POCl_3$ is disposed in the other end of the furnace. The wafer is heated to a temperature of from 1100° C. to 1300° C. and the $POCl_3$ to a temperature of about 20° C. The $POCl_3$ vaporizes and the phosphorus is deposited on the surfaces of the wafers. The deposition is continued for about one or two hours having a resultant coating having a thickness of several microns.

With reference to FIG. 3, the $POCl_3$ source is removed from the furnace and the wafer 10 is heated for an additional one to two hours at from 1100° C. to 1300° C. whereby the coating 18 is diffused into the wafer 10 to form n-type region 118. There is a p-n junction 20 between regions 118 and 14.

The depth of the region 118 is dependent of course on the desired parameters of the finished device, that is, in the case of a thyristor, the desired emitter depth. Satisfactory thyristors have been prepared having an emitter depth of from 10 to 15 microns. It is to be understood of course that the dopant, phosphorus in this example, is not diffused completely through the p-type region 14.

The doping level of region 118 is also dependent upon the design parameters of the finished device. A doping level of $10^{17}$ atoms/cc. has been found satisfactory for many thyristors.

If desired, the steps of depositing the phosphorus and the diffusion of the phosphorus with the wafer may be repeated. The repeating of these steps has a gettering effect on impurities within the wafer.

If these steps are repeated care must be exercised to ensure that the final depth and concentration of the resultant region does not exceed the desired parameters.

With reference to FIG. 4, a layer 22 of a photoresist masking material such as that sold commercially under the trade name KMER is disposed on surface 24 of the wafer 10. Portions of the photoresist masking material is removed in a predetermined pattern as at 26 and the exposed portions of region 118 is etched away. The etching is carried out to a depth greater than region 118 whereby the resulting etch grooves extend below p-n junction 20 as shown in FIG. 5.

In addition, and with reference to FIGS. 4 and 5, extremities 30 and 32 of the wafer 10 and bottom portion 218 of n-type region 118 are removed during the etching. As a result of the etching, region 14 is divided into region 14 and region 114.

The p-n junctions 16 and 20 now terminate at the edges of the wafer as does p-n junction 116 between regions 12 and 14.

Following the etching, the layer 22 of photoresist masking material is removed from surface 24 of the masking material.

With reference to FIG. 6, an electrical contact 40 consisting of a metal selected from the group consisting of molybdenum, tungsten, tantalum and base alloys thereof is soldered to surface 42 of wafer 10 with a layer 44 of an aluminum base solder.

Simultaneously, or immediately following the joining of contact 40, a groove 46 is cut or etched in the central portion 48 of n-type region 118 by chemical etching or any other suitable means forming a portion 50. A body 50 of a p-type dopant, such for example aluminum is alloyed through the portion 50, across the p-n junction 20 segment and into p-type region 14.

A layer 54 of aluminum is then deposited over surface 24 of n-type region 118 including the grooves formed therein by etching, by evaporation, electro-plating or the like and is then sintered.

The semiconductor device 110 shown in FIG. 6 is a shorted emitter thyristor.

Layer 54 is the shorted emitter contact, portion 50 with body 52 alloyed therewith is the base contact and contact 40 forms the third contact.

The device 110 has been prepared without subjecting the semiconductor material to the thermal cycling required by prior art processes during the formation of any oxide layers.

While the invention has been described with reference to particular embodiments, it will be appreciated, of course, that modifications substitutions and the like may be made without departing from its scope.

We claim as our invention:

1. A process for making a semiconductor device comprising:

(1) depositing a coating of a doping impurity capable of forming a region of a second-type of semiconductivity upon all exposed surfaces of a body of semiconductor material, said body having a central core region of said second-type of semiconductivity surrounded by a peripheral region of a first-type of semiconductivity, said peripheral region extending from said core region to the surfaces of said wafer, there being a p-n junction between said core region and said peripheral region, (2) diffusing said doping material into said peripheral region to a depth less than the thickness of said peripheral region, whereby a second region of second-type semiconductivity is formed within said wafer, and a p-n junction is formed between said second-region of second-type semiconductivity and said peripheral region, (3) disposing a photoresist mask in a predetermined pattern on the top surface of said wafer, (4) etching said wafer whereby said pattern is etched completely through said second region of second-type semiconductivity to said region of first-type semiconductivity on the top surface and said second region of second-type of semiconductivity is totally removed from the rest of the wafer, and (5) affixing electrical contacts to selected regions of the wafer, the electrical contact to the original peripheral region being formed by alloying through a portion of said second region of second type of semiconductivity.

2. The process of claim 1 in which the steps of depositing and diffusing the doping impurity to form a region of a second-type of semiconductivity within the wafer is repeated prior to disposing the photoresist mask on the top surface of the wafer.

3. The process of claim 1 in which coating of doping material is deposited by vapor diffusion.

4. The process of claim 1 in which coating of doping material is deposited by vapor diffusion from a liquid source.

References Cited

UNITED STATES PATENTS

| | | | |
|---|---|---|---|
| 2,861,018 | 11/1958 | Fuller et al. | 148—189 X |
| 3,042,565 | 7/1962 | Lehovec. | |
| 3,249,831 | 5/1966 | New et al. | |
| 3,261,074 | 7/1966 | Beauzee. | |
| 3,362,858 | 1/1968 | Knopp | 148—186 X |

L. DEWAYNE RUTLEDGE, Primary Examiner

R. A. LESTER, Assistant Examiner

U.S. Cl. X.R.

29—576, 580; 148—186, 188, 189